(12) United States Patent
Jain et al.

(10) Patent No.: US 7,408,393 B1
(45) Date of Patent: Aug. 5, 2008

(54) MASTER-SLAVE FLIP-FLOP AND CLOCKING SCHEME

(75) Inventors: Dhruv Jain, Woodland Hills, CA (US); Gopal Raghavan, Thousand Oaks, CA (US); Jeffrey C. Yen, Camarillo, CA (US); Carl W. Pobanz, Topanga, CA (US)

(73) Assignee: Inphi Corporation, Westlake Village, CA (US)

( * ) Notice: Subject to any disclaimer, the term of this patent is extended or adjusted under 35 U.S.C. 154(b) by 25 days.

(21) Appl. No.: 11/716,079

(22) Filed: Mar. 8, 2007

(51) Int. Cl.
*H03K 3/289* (2006.01)
(52) U.S. Cl. .................................. 327/202; 327/218
(58) Field of Classification Search ................ None
See application file for complete search history.

(56) References Cited

U.S. PATENT DOCUMENTS 5,259,006 A * 11/1993 Price et al. .................. 375/356
5,864,252 A * 1/1999 Tran et al. ................... 327/202
5,999,030 A * 12/1999 Inoue .......................... 327/202
6,452,433 B1 * 9/2002 Chang et al. ................ 327/202
2005/0005214 A1 * 1/2005 Ueda .......................... 714/726

OTHER PUBLICATIONS

Jedec Standard; "Definition of the SSTUB32866 1.8-V Configurable Registered Buffer With Parity Test for DDR2 RDIMM Applications"; Jedec Solid State Technology Association; Jan. 2006; pp. 1-36.

* cited by examiner

*Primary Examiner*—Cassandra Cox
(74) *Attorney, Agent, or Firm*—Koppel, Patrick, Heybl & Dawson

(57) ABSTRACT

A master-slave flip-flop comprises master and slave latches, with the data output of the master latch connected to the data input of the slave latch. The latches receive clock signals CKM and CKS at their respective clock inputs; each latch is transparent when its clock signal is in a first state and latches a signal applied to its input when its clock signal is in a second state. A clock buffer receives an input clock $CK_{in}$ and generates nominally complementary clock signals CKM and CKS such that one latch is latched while the other is transparent. The clock buffer is arranged to skew CKS with respect to CKM such that the slave latch is made transparent earlier than it would without the skew, making the minimum delay ($t_{pd}$) between the toggling of $CK_{in}$ and a resulting change at the slave latch's output less than it would otherwise be.

11 Claims, 3 Drawing Sheets

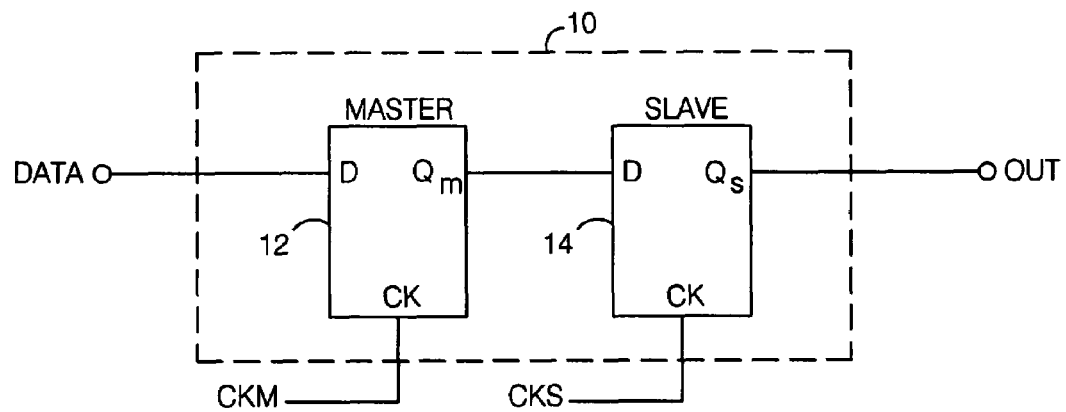
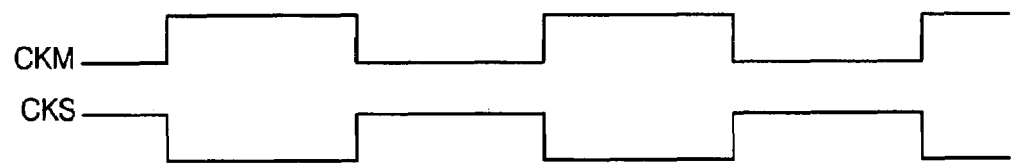
FIG.1
(Prior Art)
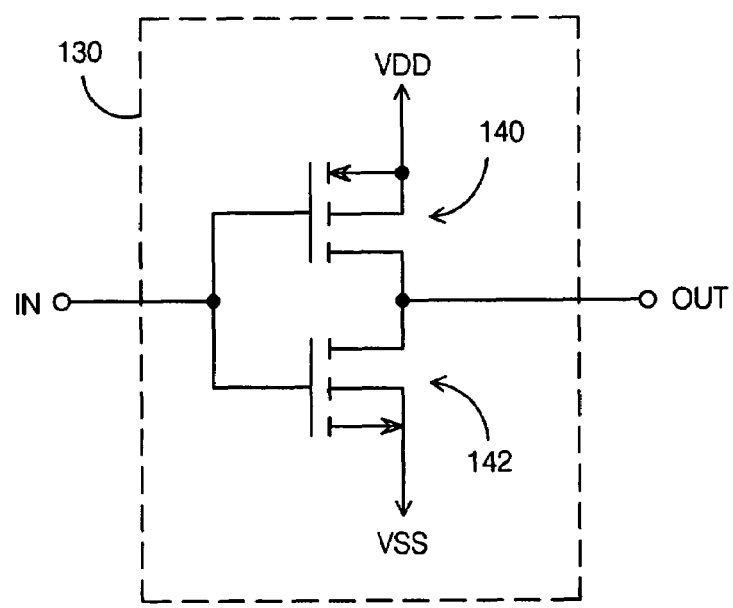
FIG.6

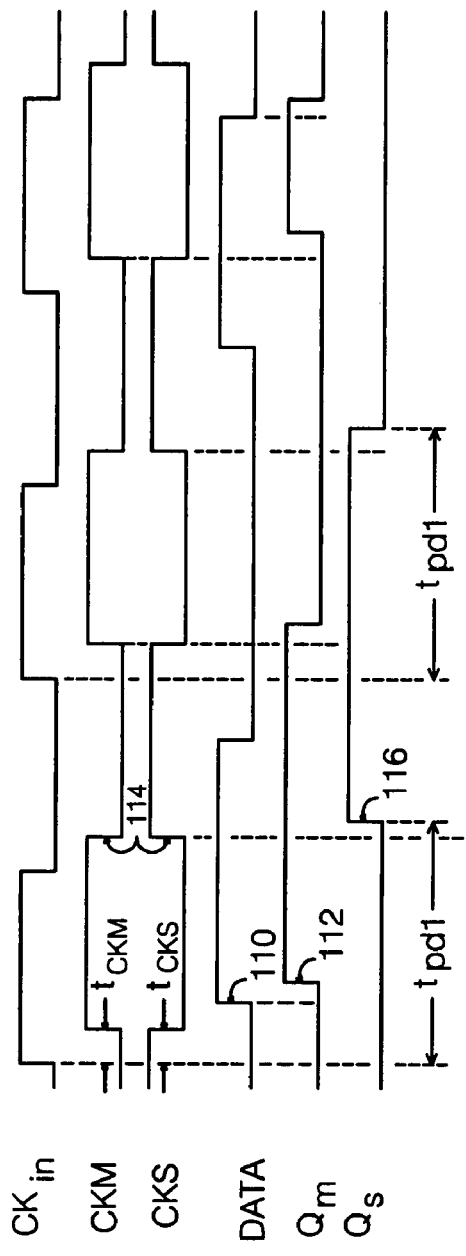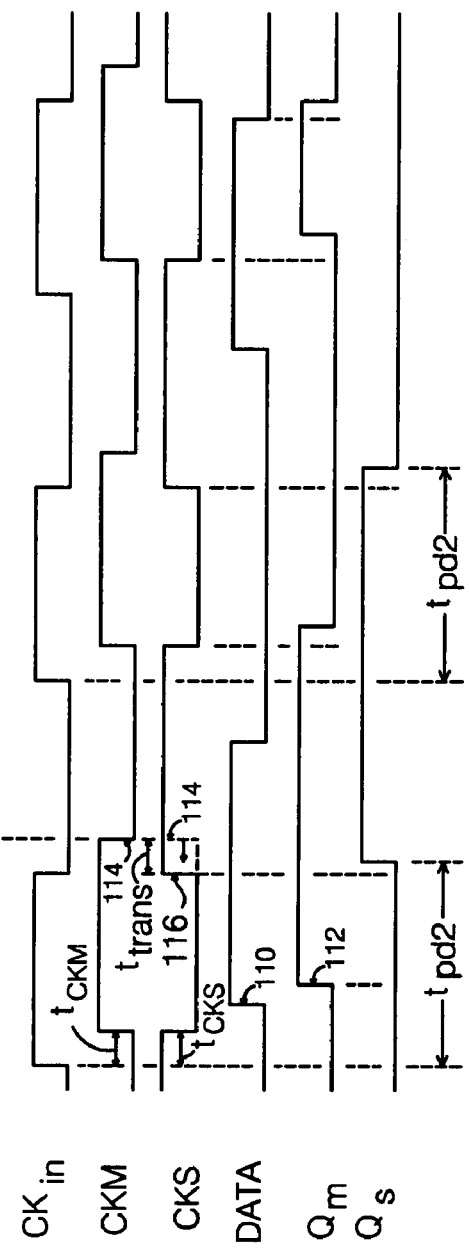

MASTER-SLAVE FLIP-FLOP AND CLOCKING SCHEME

BACKGROUND OF THE INVENTION

1. Field of the Invention

This invention relates to the field of flip-flops, and particularly to master-slave flip-flops and methods to improve their timing margins.

2. Description of the Related Art

A master-slave flip-flop 10, such as that shown in FIG. 1, is formed by connecting a first D latch 12—the "master"—in series with a second D latch 14—the "slave", and clocking the latches with complementary clocks CKM and CKS, respectively. For a negative-edge triggered master-slave flip-flop, a signal applied to each latch's D input is transferred to its Q output—i.e., the latch is "transparent"—when its clock is high, and the latch "locks" an applied input signal when its clock is low. Thus, a signal applied to the D input of master latch 12 is transferred to slave latch 14 when CKM is high, is latched by master latch 12 and transferred to the Q output of slave latch 14 when CKM goes low and CKS goes high, and is latched by slave latch 14 when CKS goes low. Since CKM and CKS are complementary, the master-slave flip-flop is never fully transparent.

Master-slave flip-flops are widely used. One application in which they are commonly found is that of a memory register, which employs multiple master-slave flip-flops to store respective data bits. Some memory registers, such as those found in DDR2/3 DRAM devices, must comply with specifications promulgated by the JEDEC Solid State Technology Association. One parameter so specified is that of propagation delay ($t_{pd}$), which is defined as the delay between the toggling of an input clock ($CK_{in}$) from which CKM and CKS are derived, and a resulting change at the slave latch's output. For some high-speed memory systems, the $t_{pd}$ specification may be necessarily short, and difficult or impossible for some master-slave flip-flops to meet.

SUMMARY OF THE INVENTION

A master-slave flip-flop is presented which improves on the performance of conventional devices, by employing a clocking scheme which reduces propagation delay ($t_{pd}$).

The present master-slave flip-flop comprises a master latch and a slave latch having respective data inputs, data outputs, and clock inputs, with the data output of the master latch connected to the data input of the slave latch. The data input of the master latch is the flip-flop's data input, and the data output of the slave latch is the flip-flop's data output.

The master and slave latches receive clock signals CKM and CKS at their respective clock inputs. Each latch is arranged to be transparent when its clock signal is in a first state, and to latch a logic signal applied to its data input when its clock signal is in a second state.

A clock buffer is arranged to provide clock signals CKM and CKS such that CKM and CKS are nominally complementary, but with CKS skewed with respect to CKM such that the slave latch is made transparent earlier than it would without the skew. When the buffer is arranged such that CKM and CKS are derived from and toggle in response to an input clock $CK_{in}$, skewing CKS in this way makes the delay ($t_{pd}$) between the toggling of $CK_{in}$ and a resulting change at the slave latch's output less than it would be otherwise.

The flip-flop may be part of a register which complies with the DDR2 and DDR3 specifications promulgated by JEDEC. These specifications also include a set-up time ($t_{su}$) which specifies how long data must be present at the flip-flop input before $CK_{in}$ toggles. The present clocking scheme can be further arranged such that the master latch is latched after the slave latch is made transparent (such that both latches are temporarily transparent), thereby preserving set-up time that would otherwise be lost by advancing CKM to keep it in alignment with CKS.

Further features and advantages of the invention will be apparent to those skilled in the art from the following detailed description, taken together with the accompanying drawings.

BRIEF DESCRIPTION OF THE DRAWINGS

FIG. 1 are schematic and timing diagrams illustrating the arrangement and operation of a conventional master-slave flip-flop.

FIG. 3 is a timing diagram illustrating the operation of the flip-flop of FIG. 2 using a conventional clocking scheme.

FIG. 4 is a timing diagram illustrating the operation of the flip-flop of FIG. 2 using a clocking scheme per the present invention.

FIG. 6 is a schematic diagram of an inverter as might be used in the clock buffer of FIG. 5.

DETAILED DESCRIPTION OF THE INVENTION

Figure 2:
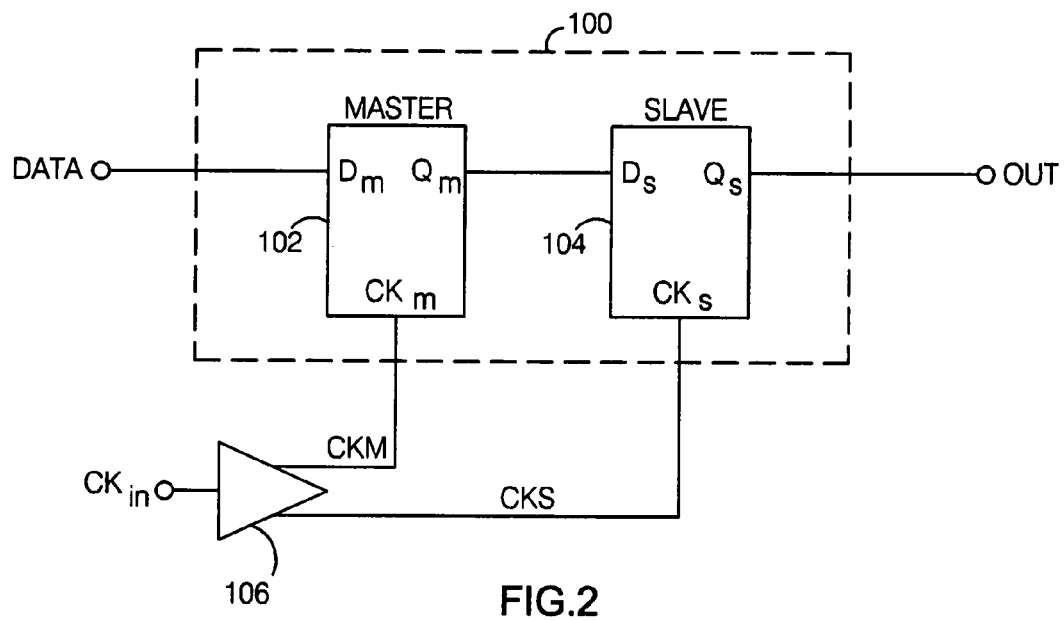
FIG. 2 is a block/schematic diagram of a master-slave flip-flop per the present invention.

A block/schematic diagram of a master-slave flip-flop 100 per the present invention is shown in FIG. 2. The flip-flop includes a master latch 102 and a slave latch 104 having respective data inputs ($D_m$, $D_s$), data outputs ($Q_m$, $Q_s$), and clock inputs ($CK_m$, $CK_s$), with the data output of master latch 102 connected to the data input of slave latch 104. Master latch data input $D_m$ serves as the flip-flop's data input, and data output $Q_s$ of slave latch 104 provides the flip-flop's data output.

The master and slave latches receive clock signals CKM and CKS, respectively, at their respective clock inputs. Each latch is arranged to be transparent when its clock signal is in a first state, and to latch a logic signal applied to its data input when its clock signal is in a second state.

The flip-flop also includes a clock buffer 106 which provides clock signals CKM and CKS. As discussed above, a master-slave flip-flop is typically driven with a pair of complementary clocks, such that one latch is transparent while the other is latched. Here, clock buffer 106 is arranged such that clock signals CKM and CKS are nominally complementary, but with CKS skewed with respect to CKM such that slave latch 104 is made transparent earlier than it would without the skew.

Clock buffer 106 is preferably arranged such that CKM and CKS are derived from and toggle in response to an input clock $CK_{in}$. As discussed above, propagation delay time $t_{pd}$ is defined as the delay between the toggling of $CK_{in}$ and a resulting change at the slave latch's output. When CKS is skewed such that slave latch 104 is made transparent earlier than it would without the skew, the value of $t_{pd}$ is reduced. Reducing $t_{pd}$ is this way enables a system employing the flip-flop, such as a memory register in compliance with the DDR2/3 specifications promulgated by JEDEC, to operate more reliably or at a higher clock speed than would otherwise be possible.

As previously noted, master-slave flip-flops may be subject to specifications other than $t_{pd}$. One such specification is "set-up time" ($t_{su}$), which specifies how long data must be present at the flip-flop input before $CK_{in}$ toggles. The present clocking scheme can be further arranged such that the master latch is latched after the slave latch is made transparent (such that both latches are temporarily transparent), thereby preserving set-up time that would otherwise be lost if CKM were advanced to keep it in alignment with the skewed CKS.

An illustration of the operation of master-slave flip-flop 100 with clock signals CKM and CKS being conventionally complementary is shown in FIG. 3, and with clock signal CKS skewed with respect to CKM as described above shown in FIG. 4. CKM and CKS are derived from $CK_{in}$, and as shown in FIG. 3, toggle after respective delays of $t_{ckm}$ and $t_{cks}$ from the time $CK_{in}$ toggles. In this example, CKM is high when input signal DATA changes state (110); assuming master latch 102 is arranged to be transparent when CKM is high, its output $Q_m$ will toggle (112) shortly after DATA toggles. CKS is low at this time, so the output of slave latch 104 is latched.

However, when CKM and CKS toggle (114), the output ($Q_m$) of master latch 102 is latched "high", and slave latch 104 becomes transparent, so that, after propagating through slave latch 104, $Q_m$ is transferred to $Q_s$ and $Q_s$ goes high (116). As defined above, $t_{pd}$ is the delay between the toggling of $CK_{in}$ and a resulting change at the slave latch's output, and is indicated in FIG. 3 as $t_{pd1}$.

FIG. 4 illustrates the same sequence of events, except that CKS is skewed with respect to CKM as described herein, such that slave latch 104 is made transparent earlier than it would without the skew. Rather than have CKS toggle from low-to-high at time 114, it is made to toggle earlier (116). Now, slave latch 104 becomes transparent earlier than it would without the skew, with the result being that $Q_s$ also toggles sooner. Delay time $t_{pd}$ using this clocking scheme is indicated in FIG. 4 as $t_{pd2}$.

To prevent both latches from being simultaneously transparent, master latch 102 should latch at the same time that slave latch 104 is made transparent. This would require keeping the falling edge of CKM in alignment with the rising edge of CKS for the example shown in FIG. 4. However, doing so would reduce the available set-up time ($t_{su}$), forcing the data to arrive earlier if a specified $t_{su}$ must be maintained. One way in which this can be avoided is by letting CKM toggle at its "normal" time (114), so as to prevent any degradation of $t_{su}$.

Advancing the time at which slave latch 104 is made transparent results in a period of time—indicated as $t_{trans}$ in FIG. 4—during which both latches are transparent. This could pose a problem in some systems in which input data may toggle at unexpected times. However, in many systems, the expected behavior of the input data is well-defined. If the data is expected to be stable during time $t_{trans}$, the clocking scheme described herein presents a small or negligible reliability issue.

Note that the present invention applies equally to a master-slave flip-flop having the opposite polarity to the one illustrated in FIGS. 3 and 4, with the master and slave latches transparent when their clock signals are low, and latched when their clock signals are high. In this case, the falling edge of CKS would be made to arrive earlier than it would with no skew.

The present flip-flop might also include internal logic which provides an inversion, so that CKS and CKM could be nominally synchronous. It is only essential that the flip-flop be driven with clocks skewed such that the slave latch is made transparent earlier than it would be without the skew.

Figure 5:
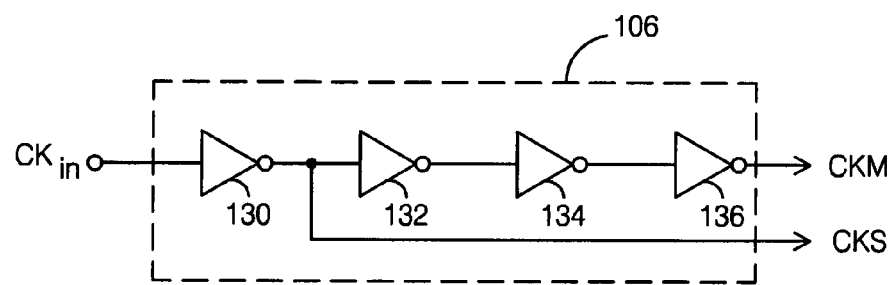
FIG. 5 is a schematic diagram of one possible implementation of a clock buffer as might be used as part of the present invention.

One possible implementation of clock buffer 106 is shown in FIG. 5. A plurality of inverters are connected in series, with the first inverter being driven by input clock $CK_{in}$. In this exemplary embodiment, the output of inverter 130 provides CKS. Several additional inverters (132, 134, 136) are connected in series with the output of inverter 130, one of which provides clock signal CKM. The skew of CKS with respect to CKM is adjusted by varying the number of inverters between $CK_{in}$ and CKS, and/or between CKS and CKM.

Note that there are many possible ways to implement clock buffer 106; the implementation shown in FIG. 5 is just one possibility. Many different designs could be employed to provide and skew the clock signals as needed.

It may also be desirable to implement the clock buffer so that the clock signal slew rates are asymmetric. For example, the rising edge of CKS can be made to have a faster slew rate than its falling edge, thereby further reducing $t_{pd}$. This could be accomplished by, for example, adjusting the relative sizes of the transistors making up the inverter which produces CKS. A typical inverter schematic is shown in FIG. 6. By making transistor 140 larger than transistor 142, OUT will be pulled up faster than it will be pulled down. This will cause the falling edge of CKS to slew more slowly, but as the timing of the falling edge does not effect $t_{pd}$, this is not a concern.

While particular embodiments of the invention have been shown and described, numerous variations and alternate embodiments will occur to those skilled in the art. Accordingly, it is intended that the invention be limited only in terms of the appended claims.

We claim:

1. A master-slave flip-flop, comprising:
a master latch and a slave latch having
respective data inputs, data outputs, and clock inputs, the data output of said master latch connected to the data input of said slave latch, the data input of said master latch being said flip-flop's data input and the data output of said slave latch being said flip-flop's data output,
said master and slave latches receiving clock signals (CKM) and (CKS) at their respective clock inputs,
each latch arranged to be transparent such that it transfers a logic signal applied to its data input to its data output when its clock signal is in a first state, and to latch a logic signal applied to its data input when its clock signal is in a second state; and
a clock buffer arranged to provide clock signals (CKM) and (CKS) such that (CKM) and (CKS) are nominally complementary, said buffer further arranged to skew (CKS) with respect to (CKM) such that said slave latch is made transparent earlier than it would without said skew.

2. The flip-flop of claim 1, wherein said clock buffer is arranged such that (CKM) and (CKS) toggle in response to the toggling of an input clock $CK_{in}$ from which (CKM) and (CKS) are derived, said buffer arranged to skew (CKS) with respect to (CKM) such that the minimum delay ($t_{pd}$) between the toggling of $CK_{in}$ and a resulting change at said slave latch's output is less than it would be without said skew.

3. The flip-flop of claim 2, wherein said buffer comprises a plurality of series-connected inverters, the input of the first inverter coupled to $CK_{in}$, said clock signals (CKS) and (CKM) provided by the outputs of respective ones of said inverters.

4. The flip-flop of claim 1, wherein said clock buffer is further arranged to generate (CKM) with respect to (CKS) such that said master latch is latched after said slave latch is made transparent, such that both latches are temporarily transparent.

5. The flip-flop of claim 1, wherein each of said latches is transparent when its clock signal is at a logic "high" and is latched when its clock signal is at a logic "low", such that each latch transitions from latched to transparent on the rising edge of its clock signal and transitions from transparent to latched on the falling edge of its clock signal, said clock buffer thereby arranged such that the rising edge of (CKS) occurs earlier than it would without said skew.

6. The flip-flop of claim 5, wherein said clock buffer is arranged such that the slew rate of the rising edge of (CKS) is faster than the slew rate of the falling edge of (CKS).

7. The flip-flop of claim 1, wherein each of said latches is transparent when its clock signal is at a logic "low" and is latched when its clock signal is at a logic "high", such that each latch transitions from latched to transparent on the falling edge of its clock signal and transitions from transparent to latched on the rising edge of its clock signal, said clock buffer thereby arranged such that the falling edge of (CKS) occurs earlier than it would without said skew.

8. The flip-flop of claim 1, wherein said flip-flop is part of a memory register which complies with the DDR2 or DDR3 specifications promulgated by JEDEC.

9. A master-slave flip-flop, comprising:
   a master latch and a slave latch having respective data inputs, data outputs, and clock inputs, the data output of said master latch connected to the data input of said slave latch, the data input of said master latch being said flip-flop's data input and the data output of said slave latch being said flip-flop's data output, said master and slave latches receiving clock signals (CKM) and (CKS) at their respective clock inputs,
   each latch arranged to be transparent such that it transfers a logic signal applied to its data input to its data output when its clock signal is in a logic "high" state and to latch a logic signal applied to its data input when its clock signal is in a logic "low" state such that each latch transitions from latched to transparent on the rising edge of its clock signal and transitions from transparent to latched on the falling edge of its clock signal;
   a clock buffer arranged to receive an input clock $CK_{in}$ and to generate clock signals (CKM) and (CKS) such that (CKM) and (CKS) are derived from and toggle in response to the toggling of $CK_{in}$ and such that (CKM) and (CKS) are nominally complementary, said buffer arranged to skew (CKS) with respect to (CKM) the rising edge of (CKS) occurs earlier than it would without said skew, such that the minimum delay ($t_{pd}$) between the toggling of $CK_{in}$ and a resulting change at said slave latch's output is less than it would be without said skew.

10. The flip-flop of claim 9, wherein said clock buffer is further arranged to generate (CKM) with respect to (CKS) such that said master latch is latched after said slave latch is made transparent, such that both latches are temporarily transparent.

11. The flip-flop of claim 9, wherein said clock buffer is arranged such that the slew rate of the rising edge of (CKS) is faster than the slew rate of the falling edge of (CKS).

* * * * *

UNITED STATES PATENT AND TRADEMARK OFFICE
CERTIFICATE OF CORRECTION

| | | |
|---|---|---|
| PATENT NO. | : 7,408,393 B1 | Page 1 of 1 |
| APPLICATION NO. | : 11/716079 | |
| DATED | : August 5, 2008 | |
| INVENTOR(S) | : Dhruv Jain et al. | |

It is certified that error appears in the above-identified patent and that said Letters Patent is hereby corrected as shown below:

Claim 9, line 23, insert the words --such that-- after (CKM)

Signed and Sealed this

Eighteenth Day of August, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,408,393 B1 | Page 1 of 1 |
| APPLICATION NO. | : 11/716079 | |
| DATED | : August 5, 2008 | |
| INVENTOR(S) | : Dhruv Jain et al. | |

It is certified that error appears in the above-identified patent and that said Letters Patent is hereby corrected as shown below:

Column 6, Claim 9, line 16, insert the words --such that-- after (CKM)

This certificate supersedes the Certificate of Correction issued August 18, 2009.

Signed and Sealed this

Eighth Day of September, 2009

David J. Kappos
*Director of the United States Patent and Trademark Office*